(12) United States Patent
Chen (10) Patent No.: US 6,462,569 B2
(45) Date of Patent: Oct. 8, 2002

(54) PROBE CARD

(76) Inventor: Andy Chen, No. 83, Tung Kuang Rd., Hsin Chu City (TW)

( * ) Notice: Subject to any disclaimer, the term of this patent is extended or adjusted under 35 U.S.C. 154(b) by 0 days.

(21) Appl. No.: 09/785,299

(22) Filed: Feb. 20, 2001

(65) Prior Publication Data

US 2002/0113608 A1 Aug. 22, 2002

(51) Int. Cl.[7] .............................................. G01R 31/02
(52) U.S. Cl. ...................................... 324/754; 324/761
(58) Field of Search ............................... 324/72.5, 754, 324/760, 761, 762, 755, 158.1; 439/169, 174, 482, 912

(56) References Cited

U.S. PATENT DOCUMENTS

| | | | | |
|---|---|---|---|---|
| 4,799,009 A | * | 1/1989 | Tada et al. ................. | 324/72.5 |
| 5,177,439 A | * | 1/1993 | Liu et al. ................... | 324/72.5 |
| 5,491,427 A | * | 2/1996 | Ueno et al. ............... | 324/158.1 |
| 5,670,889 A | * | 9/1997 | Okubo et al. ................ | 324/760 |
| 6,100,708 A | * | 8/2000 | Mizuta ........................ | 324/760 |
| 6,121,784 A | * | 9/2000 | Montoya ..................... | 324/754 |

* cited by examiner

Primary Examiner—Michael Sherry
Assistant Examiner—Minh N. Tang
(74) Attorney, Agent, or Firm—Rosenberg, Klein & Lee (57) ABSTRACT

The present invention provides a probe card including a circuit board, a plurality of electrodes, and a plurality of probes. The electrodes are provided on the circuit board. One end of each of the probes are respectively connected to the electrodes, and the other end is floating for testing chips. The present invention is characterized in that the electrodes can be arranged longitudinally parallel, transversely parallel, or slantingly parallel to the chips being tested so that improved circuit layout is achieved, sequential wiring can be obtained, and problems of wire jumping or cutting can be avoided. Therefore, maintenance is simplified and debugging time can be reduced.

4 Claims, 8 Drawing Sheets

PROBE CARD

FIELD OF THE INVENTION

The present invention relates to a probe card and, more particularly, to an improved electrode structure on a circuit board. By means of novel arrangement of the present invention, wiring can be accomplished in duplicate manner, layout and debugging can be easily performed, and working efficiency can be enhanced.

BACKGROUND OF THE INVENTION

Figure 1:
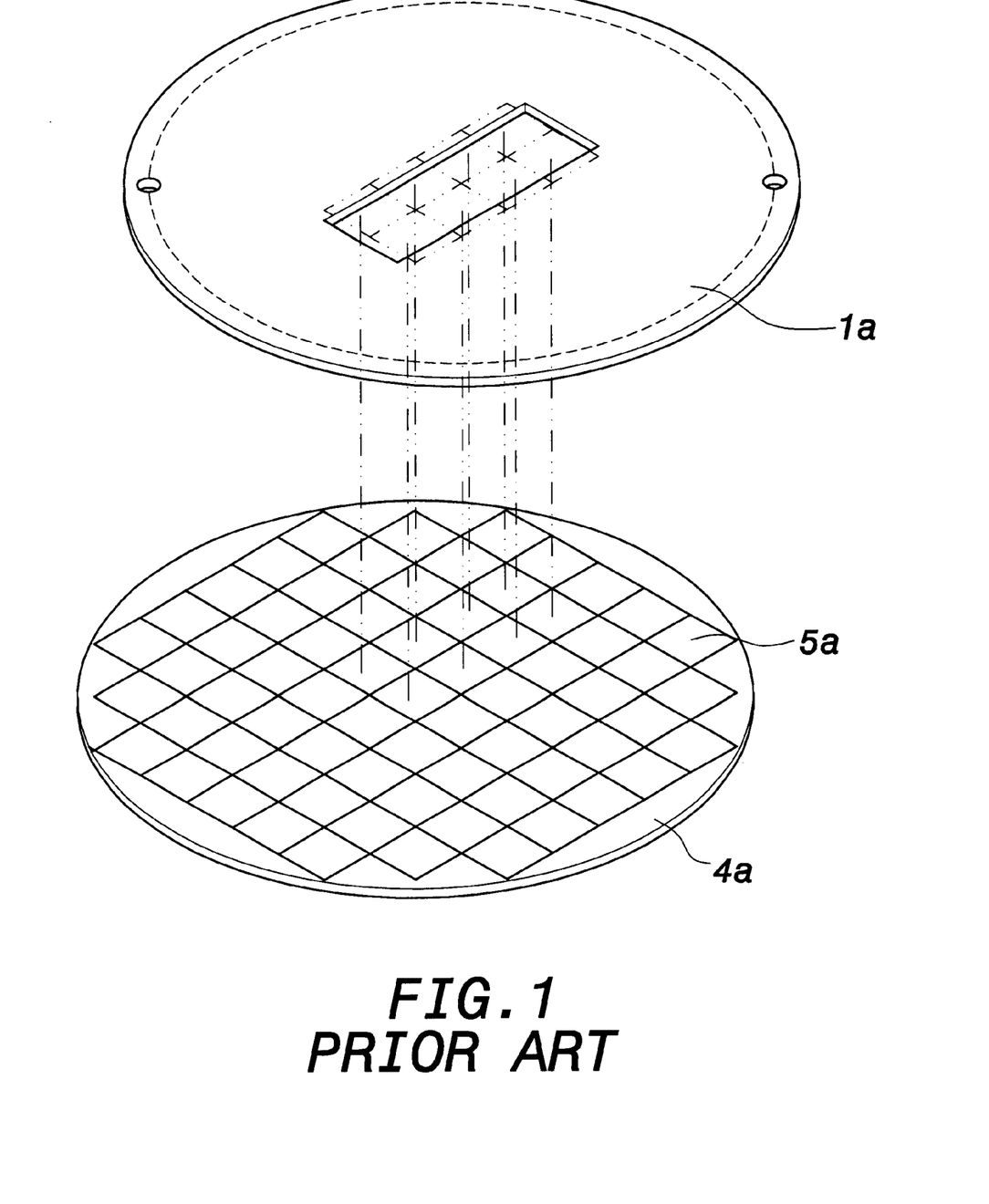
FIG. 1 is a perspective view of a prior art probe card.
Figure 2:
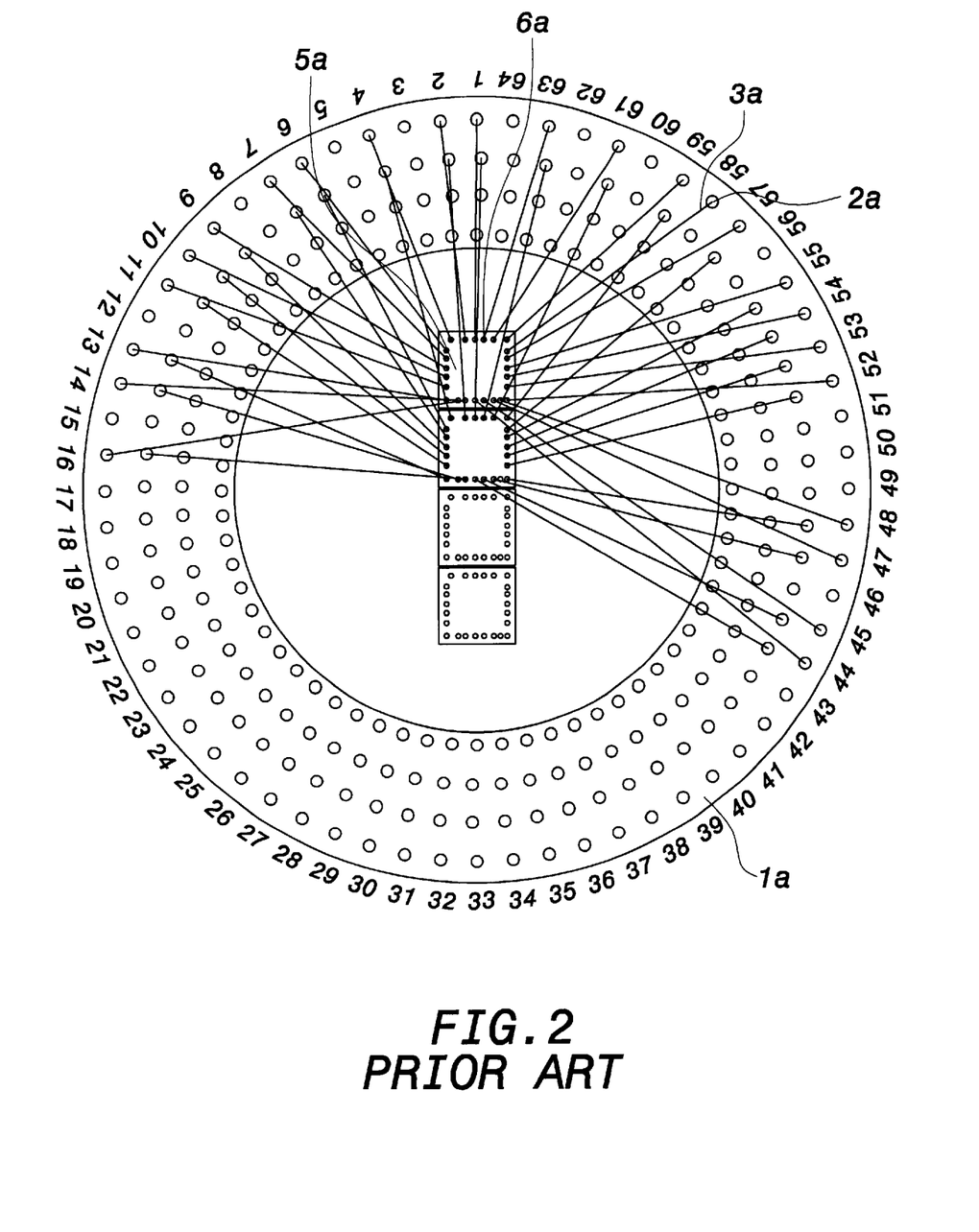
FIG. 2 is a plan view of a prior art probe card.

In the prior art, a probe card is provided on a detection head of a specially designed IC tester for testing a chip. The structure of the probe card is shown in FIGS. 1 and 2, wherein a plurality of circularly arranged electrodes 2a are provided on a circuit board 1a. The electrodes 2a are respectively connected to one ends of thin probes 3a made of gold wires. The other ends of the probes 3a are floating and can be used to detect pads 6a of a chip 5a on a wafer 4a so as to input signals to the chip 5a or detect output values from the chip 5a. By controlling an electron microscope and a machine arm, all chips 5a on the same wafer 4a can be tested one by one.

Figure 3:
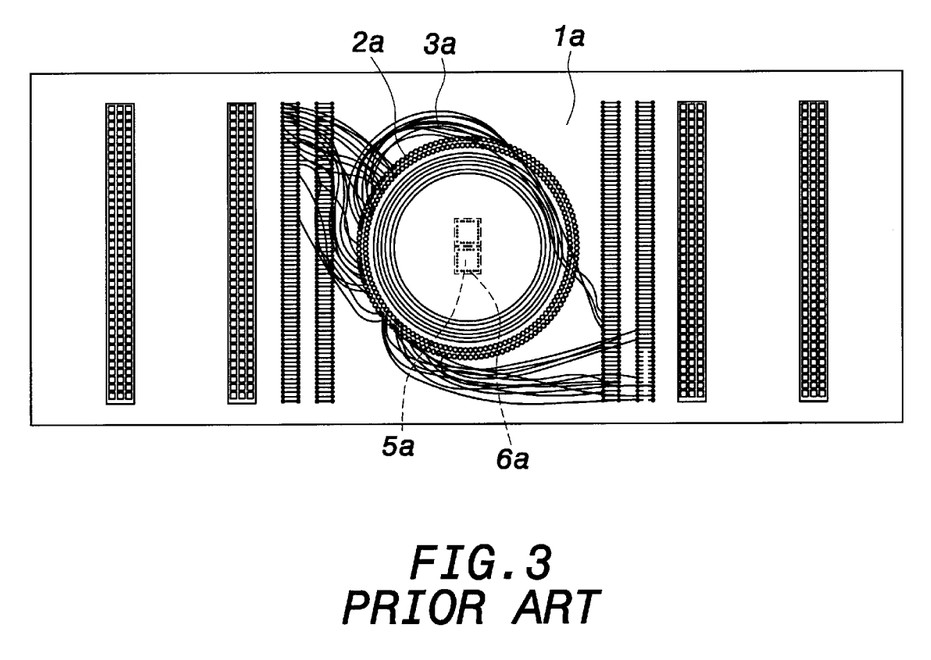
FIG. 3 is a plan view of a prior art probe card requiring wire cutting or jumping.

However, the following problems are often generated when connecting the probes 3a:

1. Wire cutting or jumping is often required to manufacture sequential wiring (shown in FIG. 3).
2. Wrong soldering after wire jumping usually occurs so as to increase the production time and cost.
3. Electrical characteristics cannot be exactly followed so that the difficulty of duplication is increased.
4. Debugging time is increased.
5. It is hard to perform on-line maintenance.

SUMMARY OF THE INVENTION

To resolve the above problems in the prior art, the primary object of the present invention is to change the arrangement manner of the electrodes from circular arrangement to parallel arrangement so as to avoid complicated wiring. Thereby, it is easy to connect the probes, and the manufacturing efficiency can be greatly enhanced.

To achieve the above object, the present invention provides a probe card comprising a circuit board, a plurality of electrodes, and a plurality of probes. The electrodes are provided on the circuit board and are parallel arranged. One ends of the probes are respectively connected to the electrodes, and the other ends thereof are floating and can be used to test chips.

The various objects and advantages of the present invention will be more readily understood from the following detailed description when read in conjunction with the appended drawings, in which:

DETAILED DESCRIPTION OF THE PREFERRED EMBODIMENTS

Figure 4:
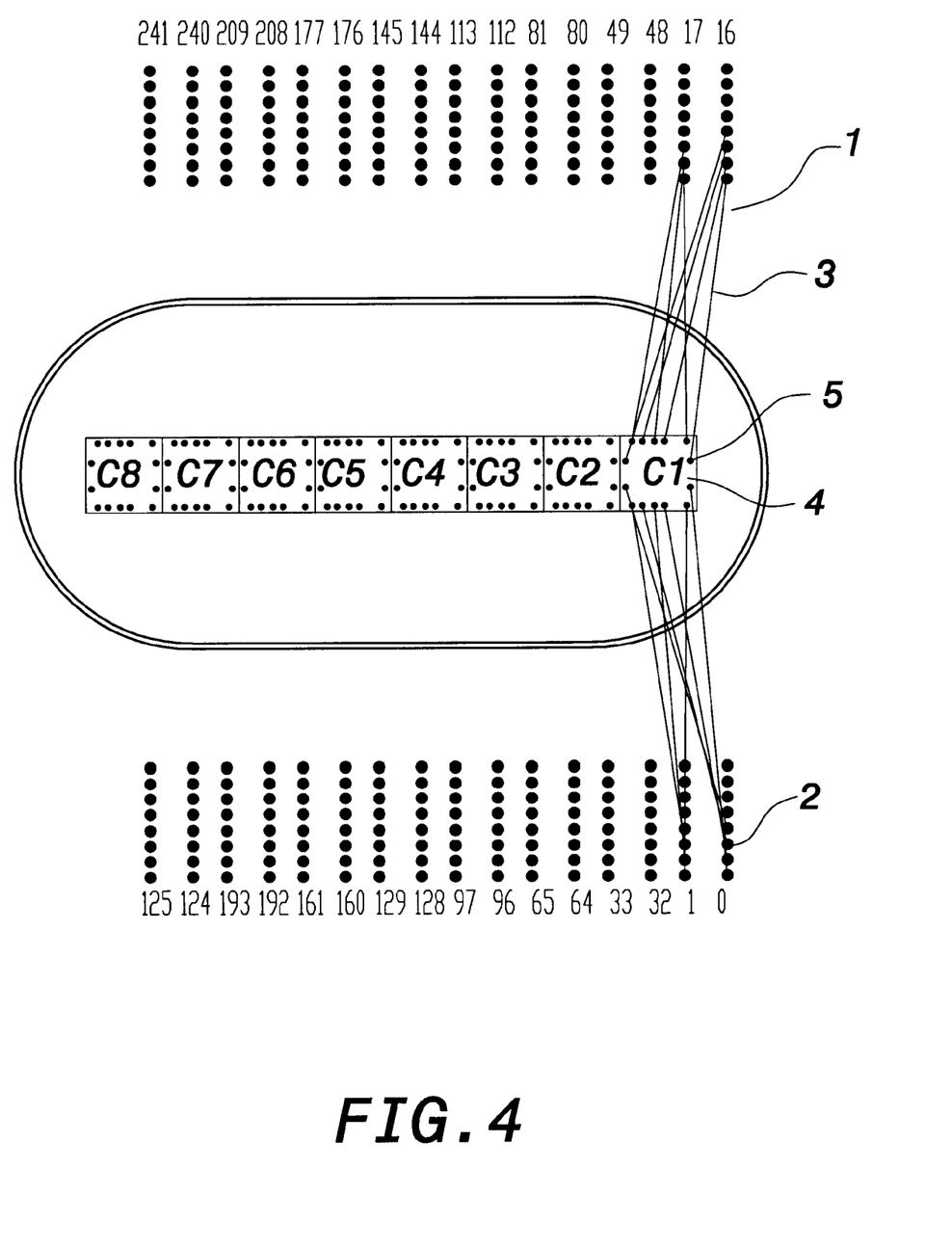
FIG. 4 is a plan view of the present invention laid out to connect a chip C1.
Figure 5:
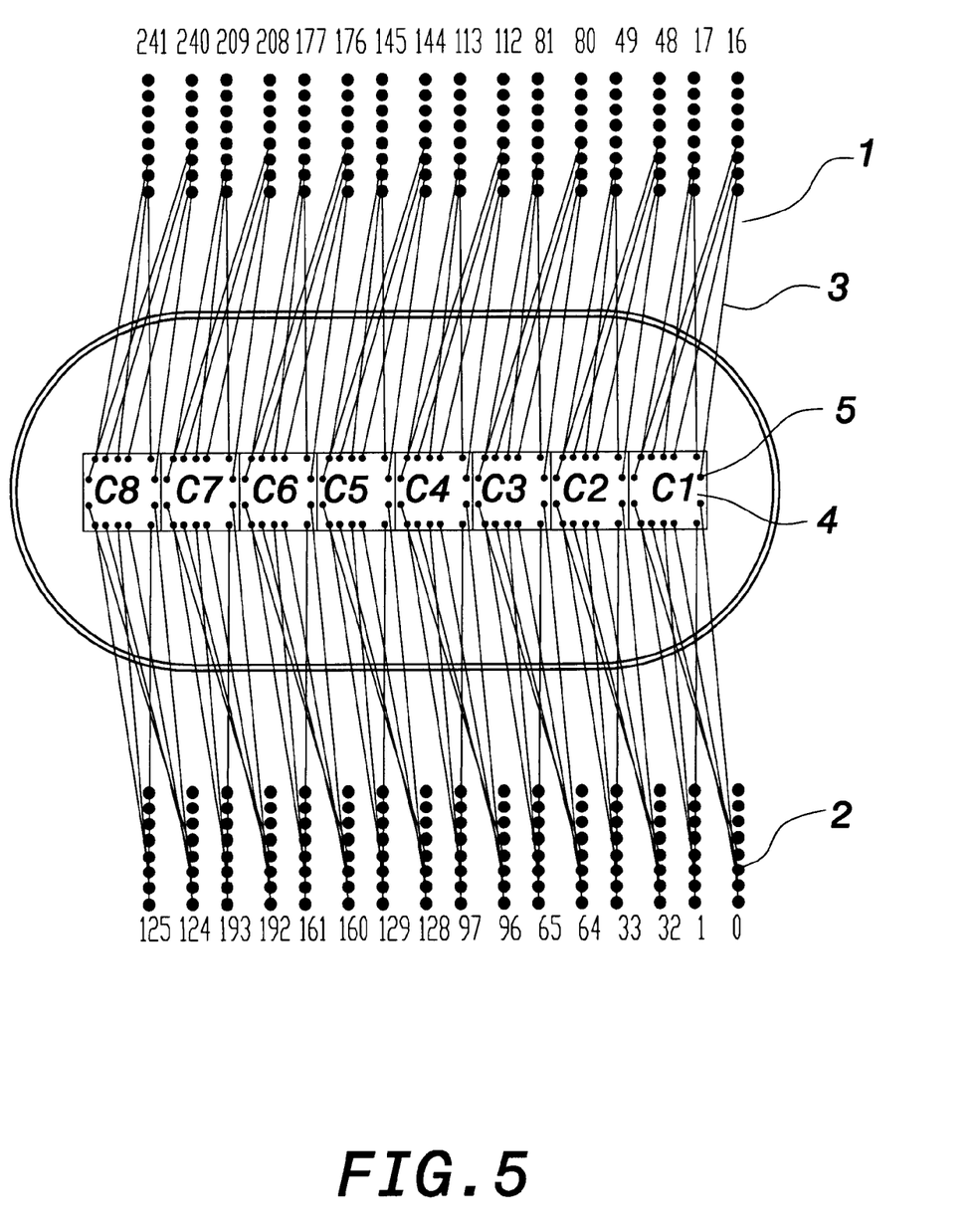
FIG. 5 is a plan view of the present invention laid out to connect all chips.

A probe card of the present invention is shown in FIGS. 4 and 5, wherein 256 longitudinally and parallel arranged electrodes 2 (respectively designated electrode 0~electrode 255) are provided on a circuit board 1. The electrodes 2 are respectively connected to one ends of the probes 3. The other ends of the probes 3 are floating. Chips 4 (respectively designated C1~C8) on a wafer (not shown) are tested in parallel processing manner.

Fourteen electrodes 2 of the electrodes 0~17 can be first selected to connect the probes 3 so that the other ends of the probes 3 correspond to fourteen pads 5 of the chip C1 to be tested. Next, fourteen electrodes 2 of the electrodes 32~49 are selected to connect the probes 3 so that the other ends of the probes 3 correspond to fourteen pads 5 of the chip C2 to be tested. The above connection way is repeated so that good layout of wiring can be achieved, conventional problems of wire cutting or jumping can be avoided, and debugging can be easily performed.

Figure 6:
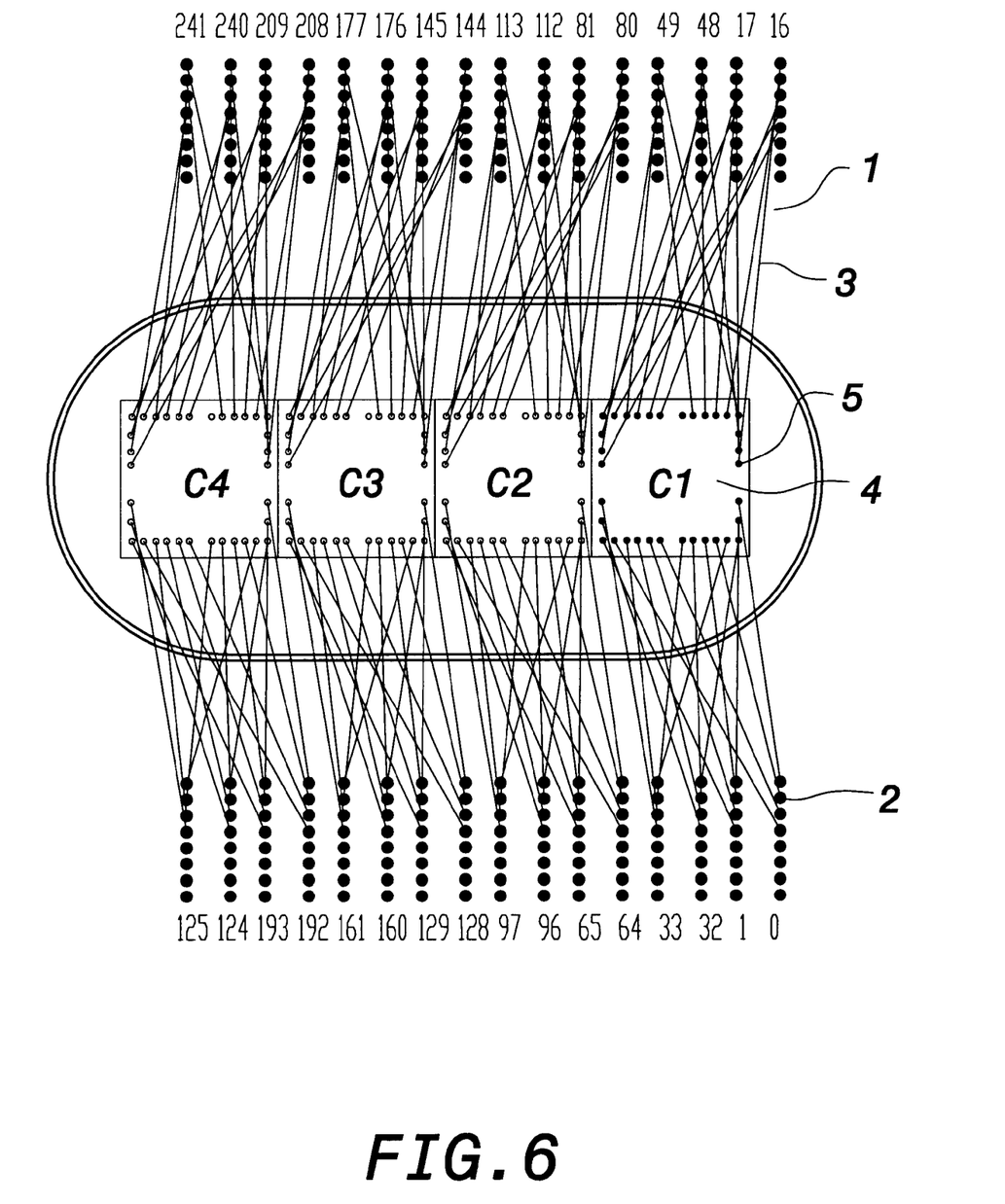
FIG. 6 is a plan view of a second embodiment of the present invention.

Additionally, FIG. 6 shows a second embodiment of the present invention, wherein thirty two pads 5 are provided on the chip 4. Similarly, thirty two electrodes 2 can be selected from the electrodes 0~49 to respectively connect the probes 3 so that the other ends of the probes 3 correspond to thirty two pads 5 of the chip C1 to be tested. Next, thirty two electrodes 2 of the electrodes 64~144 are selected to connect the probes 3 so that the other ends of the probes 3 correspond to thirty two pads 5 of the chip C2 to be tested. The above connection way is repeated so that good layout of wiring can be achieved. Therefore, a user can select a probe card having a proper number of electrodes 2 for testing according to the number of the pads 5 of the chip 4 to be tested.

Figure 7:
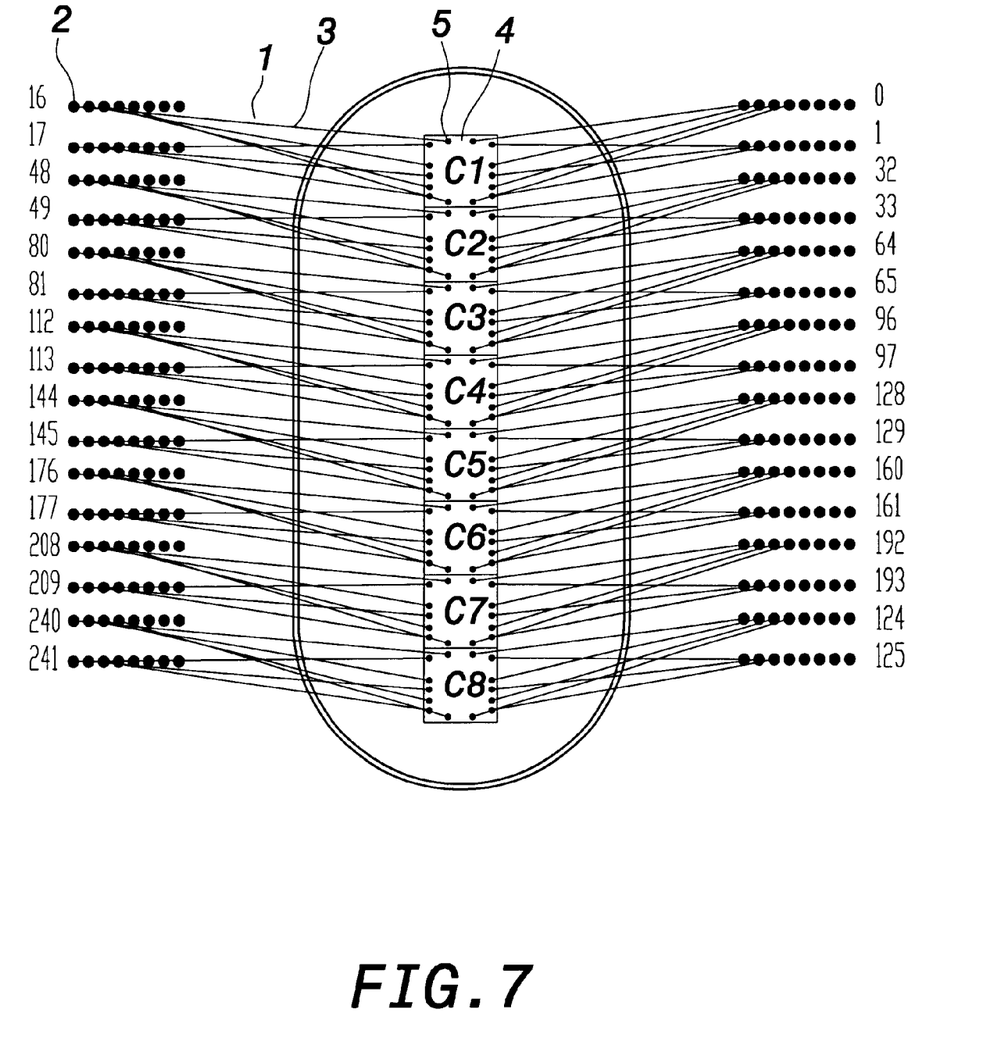
FIG. 7 is a plan view of a third embodiment of the present invention.
Figure 8:
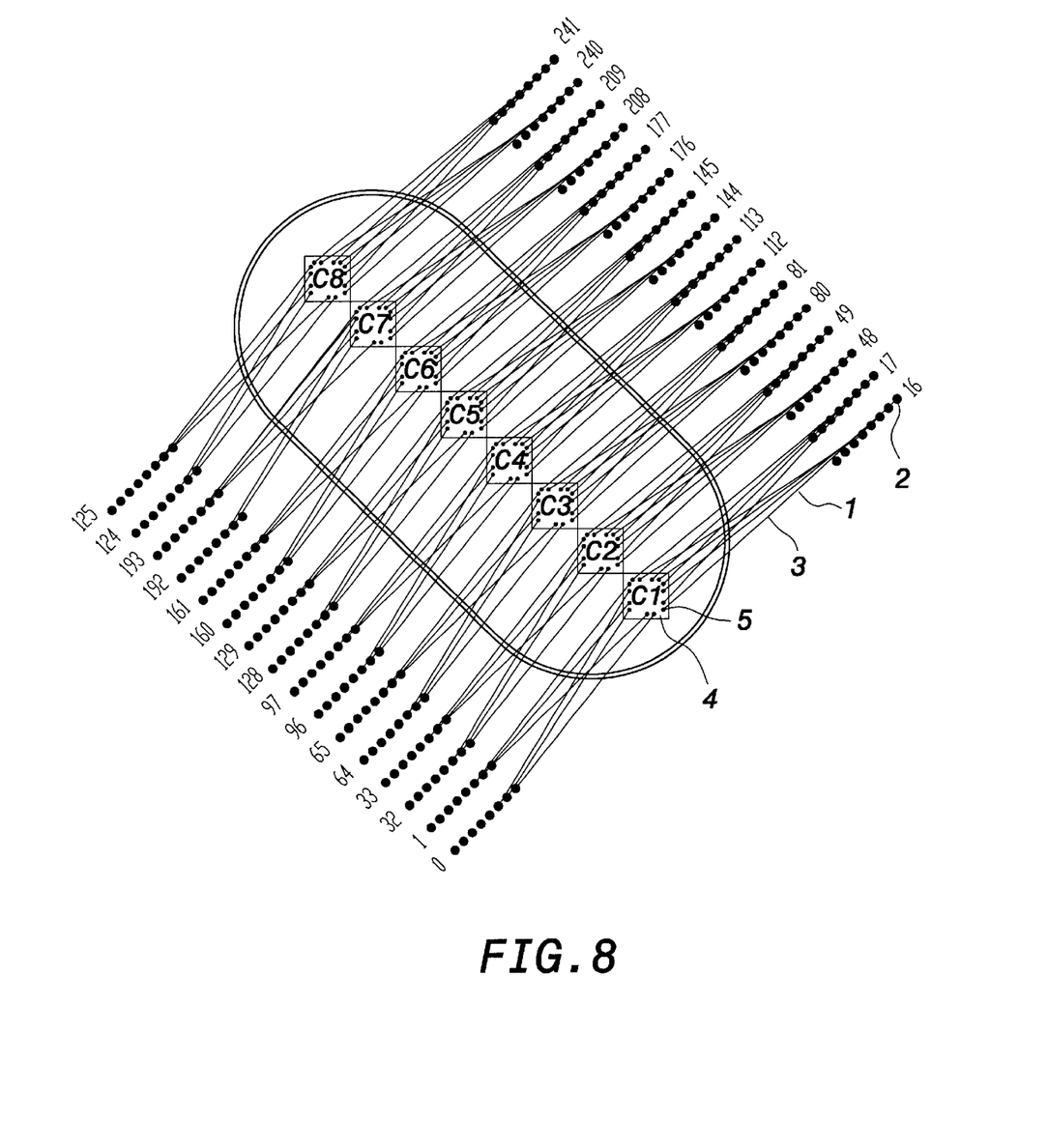
FIG. 8 is a plan view of a fourth embodiment of the present invention.

Furthermore, FIGS. 7 and 8 respectively show a third embodiment and a fourth embodiment of the present invention, wherein the electrodes 2 are longitudinally parallel arranged or slantingly parallel arranged. The connection way of the probes 3 is the same as above. In the fourth embodiment of the present invention, the chips 4 are tested in manner of parallel processing and sideway testing to match the arrangement of the chips 4 on a wafer.

To sum up, the probe card of the present invention has the following characteristics.

1. The wiring is unambiguous.
2. The manufacturing time of the probe card is shortened.
3. The count of parallel processed chips is increased.
4. Because it is easy to follow the electrical characteristics and it is easy to write the software, the production time can be greatly reduced so as to increase the efficiency and production.
5. The testing cost of mass-produced chips is reduced.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

I claim:

1. A probe card for simultaneously testing a plurality of integrated circuit chips constructed on a single wafer, each of the integrated circuit chips defined by a set of boundaries, the probe card comprising:

a circuit board;

a plurality of electrodes disposed on opposing first and second sides of said circuit board in a plurality of parallel linear groups, wherein each of said linear groups includes a first linear array of electrodes on said first side of said circuit board and a second linear array of electrodes on said second side of said circuit board; and a plurality of probe needles, each of said probe needles coupled at a proximal end thereof to an electrode of one of said plurality of linear groups of electrodes such that a distal end of said each probe needle is removably positioned within the boundaries of a respective one of the plurality of integrated circuit chips, wherein said probe needles removably positioned within the boundaries of said respective one of the plurality of integrated circuit chips are coupled to adjacent ones of said linear groups of electrodes.

2. The probe card as recited in claim 1, wherein said parallel linear groups of electrodes are longitudinally arranged with respect to the set of boundaries defining each of the integrated circuit chips.

3. The probe card as recited in claim 1, wherein said parallel linear groups of electrodes are transversely arranged with respect to the set of boundaries defining each of the integrated circuit chips.

4. The probe card as recited in claim 1, wherein said parallel linear groups of electrodes are slantedly arranged with respect to the set of boundaries defining each of the integrated circuit chips.

* * * * *